(12) United States Patent
Yoo

(10) Patent No.: US 8,995,209 B2
(45) Date of Patent: Mar. 31, 2015

(54) SEMICONDUCTOR INTEGRATED CIRCUIT AND METHOD FOR MONITORING REFERENCE VOLTAGE THEREOF

(71) Applicant: SK Hynix Inc., Icheon-si, Gyeonggi-do (KR)

(72) Inventor: Se Jin Yoo, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 95 days.

(21) Appl. No.: 13/845,909

(22) Filed: Mar. 18, 2013

(65) Prior Publication Data

US 2014/0153342 A1 Jun. 5, 2014

(30) Foreign Application Priority Data

Dec. 3, 2012 (KR) ........................ 10-2012-0138991

(51) Int. Cl.
*G11C 7/00* (2006.01)
*G11C 7/18* (2006.01)
*G11C 7/10* (2006.01)
*G11C 7/14* (2006.01)
*G11C 29/02* (2006.01)
*G11C 29/12* (2006.01)
*G11C 29/48* (2006.01)
*G11C 29/04* (2006.01)

(52) U.S. Cl.
CPC ............ *G11C 7/1096* (2013.01); *G11C 7/1084* (2013.01); *G11C 7/1048* (2013.01); *G11C 7/1066* (2013.01); *G11C 7/1069* (2013.01); *G11C 7/14* (2013.01); *G11C 29/021* (2013.01); *G11C 29/1201* (2013.01); *G11C 29/48* (2013.01); *G11C 2207/105* (2013.01); *G11C 2029/0409* (2013.01)
USPC ............ 365/189.19; 365/189.15; 365/189.16

(58) Field of Classification Search
None
See application file for complete search history.

(56) References Cited

U.S. PATENT DOCUMENTS

2006/0253663 A1* 11/2006 Johnson et al. ............... 711/154

FOREIGN PATENT DOCUMENTS

KR 100958800 B1 5/2010
KR 1020120040775 A 4/2012

* cited by examiner

*Primary Examiner* — Kretelia Graham
(74) *Attorney, Agent, or Firm* — William Park & Associates Patent Ltd.

(57) ABSTRACT

A semiconductor integrated circuit includes a write path coupled to a pad, a read path coupled to the pad, and a reference voltage output control block configured to apply a reference voltage to the pad through the write path in response to a reference voltage monitoring signal. The read path is electrically isolated from the pad in response to the reference voltage monitoring signal.

19 Claims, 2 Drawing Sheets

# SEMICONDUCTOR INTEGRATED CIRCUIT AND METHOD FOR MONITORING REFERENCE VOLTAGE THEREOF

CROSS-REFERENCES TO RELATED APPLICATION

The present application claims priority under 35 U.S.C. §119(a) to Korean application number 10-2012-0138991, filed on Dec. 3, 2012, in the Korean Intellectual Property Office, which is incorporated herein by reference in its entirety as set forth in full.

BACKGROUND

1. Technical Field

Various embodiments generally relate to a semiconductor integrated circuit, and more particularly, to a semiconductor integrated circuit and a method for monitoring a reference voltage is thereof.

2. Related Art

In a semiconductor integrated circuit, it is necessary to monitor whether an internal reference voltage is at a proper voltage level in an internal circuit block of the semiconductor integrated circuit when an external voltage is applied from an external source. A reference voltage is typically outputted through a predetermined signal output/output pad, for example, a DQ pad, in a specific mode, and is monitored by a separate monitoring apparatus which is external to the semiconductor apparatus to check whether the reference voltage is at a normal level for the semiconductor integrated circuit to normally operate.

However, when the reference voltage is outputted through the DQ pad, the reference voltage may not be outputted at a normal level due to an on-die termination operation related to the DQ pad. There is a need for a semiconductor integrated circuit that is able to output the reference voltage at a normal level and a method for monitoring the reference voltage.

SUMMARY

In an embodiment of the present invention, a semiconductor integrated circuit includes: a write path coupled to a pad; a read path coupled to the pad; and a reference voltage output control block configured to apply a reference voltage to the pad through the write path in response to a reference voltage monitoring signal, wherein the read path is electrically isolated from the pad in response to the reference voltage monitoring signal.

In an embodiment of the present invention, a semiconductor integrated circuit includes: a pad; a core block; an input buffer configured to receive external data through the pad; a peripheral circuit block configured to write the external data, which is transmitted through the input buffer, into the core block, or to receive data read from the core block; an output driver configured to receive the data read from the core block through the peripheral circuit block, and to output the data to the pad; and a reference voltage output control block configured to apply an internal reference voltage to the pad in response to a reference voltage monitoring signal, wherein the output driver is electrically isolated from the pad in response to the reference voltage monitoring signal.

In an embodiment of the present invention, a method for monitoring a reference voltage of a semiconductor integrated circuit includes the steps of: entering a reference voltage monitoring mode; outputting a reference voltage to a predetermined pad through a write path of the semiconductor integrated circuit when in the reference voltage monitoring mode; and electrically isolating a read path of the semiconductor integrated circuit from the pad when in the reference voltage monitoring mode.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit and a method for monitoring a reference voltage thereof according to the present invention will be described in detail with reference to the accompanying drawings through various embodiments.

Figure 1:
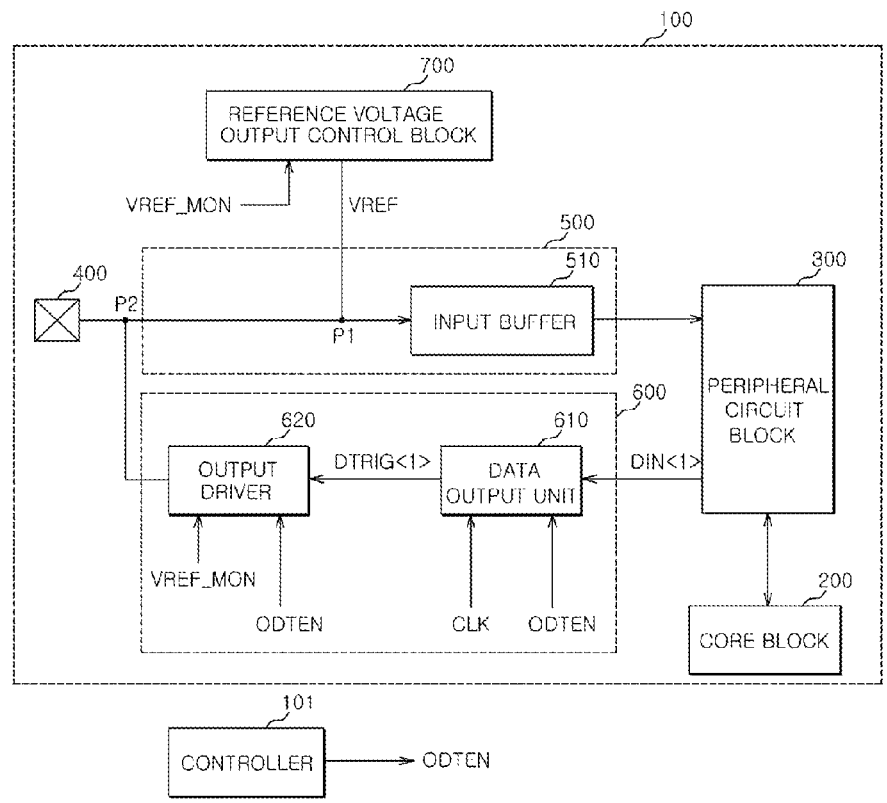
FIG. 1 is a block diagram of a semiconductor integrated circuit 100 according to an embodiment of the present invention.

As illustrated in FIG. 1, the semiconductor integrated circuit 100 according to an embodiment of the present invention may include a core block 200, a peripheral circuit block 300, an input/output pad (hereinafter, referred to as a pad) 400, a write path 500, a read path 600, and a reference voltage output control block 700.

The core block 200 may include a plurality of memory cells (not shown) and configurations for writing data in the memory cells and reading data written in the memory cells.

The peripheral circuit block 300 may include a configuration for transmitting data of the core block 200 to an external circuit apparatus (not shown) or transmitting data of an external device (not shown) to the core block 200.

The pad 400 may include a specific pad standardized among a plurality of DQ pads configured for data input/output, for example, DQ1.

The write path 500 may be configured to write data from the external device through the pad 400, into the core block 200 using the peripheral circuit block 300.

The write path 500 may include an input buffer 510.

The read path 600 may be configured to be electrically isolated from the pad 400 in response to a reference voltage monitoring signal VREF_MON.

The read path 600 may be configured to transmit data read from the core block 200 to the pad 400 using the peripheral circuit block 300.

The read path 600 may include a data output unit 610 and an output driver 620.

The data output unit 610 may be configured to synchronize data DIN<1> which is provided from the peripheral circuit block 300 with a clock signal CLK, and to output the synchronized data as data DTRIG<1>.

The data output unit 610 may be configured to deactivate the data DTRIG<1> in response to a termination signal ODTEN.

The termination signal ODTEN may be provided from an external controller 101 such as a CPU or a GPU.

The output driver 620 may be configured to drive a signal to be transmitted to the pad 400, that is, to pull-up or pull-down drive the signal of pad 400 in response to the termination signal ODTEN and the data DTRIG<1>.

The output driver 620 may drive the signal of the pad 400, and simultaneously may terminate the signal of the pad 400 using a termination resistance value according to the operation of the semiconductor integrated circuit.

The output driver 620 may be configured to electrically isolate its own output terminal from the pad 400 in response to the reference voltage monitoring signal VREF_MON.

The reference voltage output control block 700 may be configured to apply an internal reference voltage (hereinafter, referred to as a reference voltage VREF) to the pad 400 through the write path 500 in response to the reference voltage monitoring signal VREF_MON.

The reference voltage output control block 700 may be configured to apply the reference voltage VREF to a path between the input buffer 510 and the pad 400 in response to the reference voltage monitoring signal VREF_MON. A node P1 which is applied to the reference voltage VREF and a node P2 which is coupled to output terminals of the output driver 620 may be in the write path, and the node P2 may be positioned between the pad 400 and the node P1.

Figure 2:
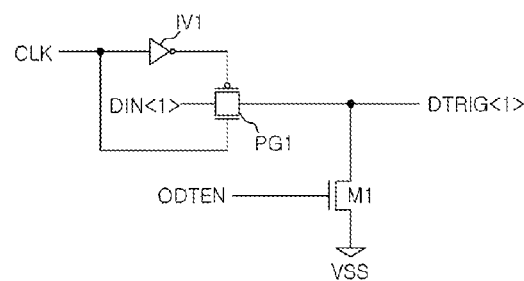
FIG. 2 is a circuit diagram illustrating the configuration of a data output unit 610 of FIG. 1.

As illustrated in FIG. 2, the data output unit 610 may include an inverter IV1, a pass gate PG1, and a transistor M1.

The pass gate PG1 may allow the data DIN<1> to pass therethrough according to the toggling of the clock signal CLK, thereby outputting the data DTRIG<1>.

The transistor M1 may connect the output of the pass gate PG1 to a ground terminal VSS when the termination signal ODTEN is activated, thereby substantially blocking an output of the data DTRIG<1>.

Figure 3:
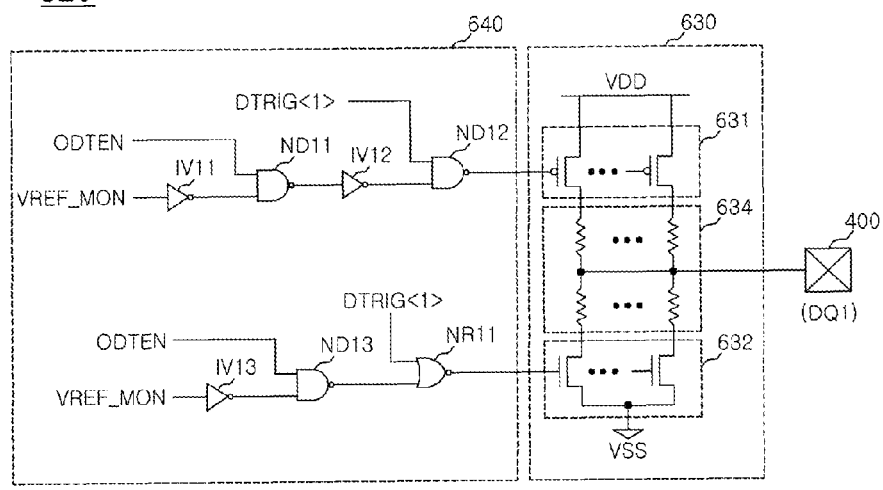
FIG. 3 is a circuit diagram illustrating the configuration of an output driver 620 of FIG. 1.

As illustrated in FIG. 3, the output driver 620 may include a driving section 630 and a driving control section 640.

The driving section 630 may include a pull-up transistor array 631, a pull-down transistor array 632, and a termination resistor array 634.

The pull-up transistor array 631 may be coupled to a power supply terminal VDD.

The termination resistor array 634 may be coupled to the pull-up transistor array 631.

The pull-down transistor array 632 may be coupled between the termination resistor array 634 and the ground terminal VSS.

In the pull-up transistor array 631 and the pull-down transistor array 632, the number of transistors to be turned on varies according to a separate control signal (not shown) related to a termination operation, resulting in a varying number of resistors to which power is applied in the termination resistor array 634.

Due to the varying number of resistors to which power is applied in the termination resistor array 634, the termination resistance value may vary.

The driving control section 640 may include a plurality of inverters IV11 to IV13, a plurality of NAND gates ND11 to ND13, and a NOR gate NR11.

When the reference voltage monitoring signal VREF_MON is deactivated, the driving control section 640 may drive the pull-up transistor array 631 according to a result obtained by performing a NAND operation on the termination signal ODTEN and the data DTRIG<1>, thereby pulling up a signal to be transmitted to the pad 400.

Further, when the reference voltage monitoring signal VREF_MON is deactivated, the driving control section 640 may drive the pull-down transistor array 632 according to a result obtained by performing a NOR operation on the termination signal ODTEN and the data DTRIG<1>, thereby pulling down the signal to be transmitted to the pad 400.

When the reference voltage monitoring signal VREF_MON is activated, the driving control section 640 may turn off the pull-up transistor array 631 and the pull-down transistor array 632 regardless of the levels of the termination signal ODTEN and the data DTRIG<1>, thereby electrically isolating its own output terminal from the pad 400. Effectively, the driving control section 640 may output signals for disabling the pull-up transistor array 631 and the pull-down transistor array 632.

Figure 4:
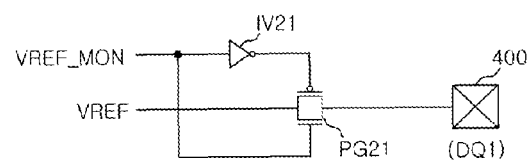
FIG. 4 is a circuit diagram illustrating the configuration of a reference voltage output control block 700 of FIG. 1.

As illustrated in FIG. 4, the reference voltage output control block 700 may include an inverter IV21 and a pass gate PG21.

When the reference voltage monitoring signal VREF_MON is activated, since the pass gate PG21 is turned on, the reference voltage output control block 700 applies the reference voltage VERF to the pad 400.

When the reference voltage monitoring signal VREF_MON is deactivated, since the pass gate PG21 is turned off, the reference voltage output control block 700 substantially prevents the reference voltage VERF from being applied to the pad 400.

A reference voltage monitoring operation of the semiconductor integrated circuit configured above according to an embodiment of the present invention will be described as follows.

When the termination signal ODTEN provided from an external controller is activated, the semiconductor integrated circuit may drive a signal to be transmitted to the pad 400 using termination resistance values corresponding to operation modes of the semiconductor integrated circuit.

Accordingly, the termination signal ODTEN may be internally deactivated using the reference voltage monitoring signal VREF_MON for defining the activation of the reference voltage monitoring operation. Thus, the output driver 620 which drives a signal to be transmitted to the pad 400 using a specific termination resistance value may be electrically isolated from the pad 400, and thus, floated.

For example, the reference voltage monitoring signal VREF_MON may be activated by a mode register set.

When the reference voltage monitoring signal VREF_MON is activated, the reference voltage output control block 700 may apply the reference voltage VREF to the pad 400.

Simultaneously, output terminals of the output driver 620 may be electrically discoupled from the pad 400 in response to the activated reference voltage monitoring signal VREF_MON.

When the reference voltage monitoring signal VREF_MON has been activated, even though the termination signal ODTEN is activated, the output driver 620 may not perform an operation for driving the pad 400 using a specific termination resistance value.

Accordingly, the reference voltage VREF may be outputted to an external circuit apparatus of the semiconductor integrated circuit 100, in the state in which the termination operation has no effect on the pad 400.

Accordingly, in the reference voltage monitoring operation state, the reference voltage VREF outputted to the external circuit apparatus of the semiconductor integrated circuit 100 may maintain an original value that is not distorted by the termination operation.

Thus, it is possible to monitor the reference voltage VREF from the external circuit apparatus, for example, a monitoring apparatus, check whether the level of the reference voltage VREF is normal, and perform a reference voltage trimming operation and the like.

While certain embodiments have been described above, it will be understood to those skilled in the art that the embodiments described are by way of example only. Accordingly, the semiconductor integrated circuit and the method for monitoring a reference voltage thereof described herein should not be limited based on the described embodiments. Rather, the semiconductor integrated circuit and the method for monitoring a reference voltage thereof described herein should only be limited in light of the claims that follow when taken in conjunction with the above description and accompanying drawings.

What is claimed is:

1. A semiconductor integrated circuit comprising:
   a write path electrically coupled to a pad;
   a read path electrically coupled to the pad; and
   a reference voltage output control block configured to apply a reference voltage to the pad through the write path in response to a reference voltage monitoring signal,
   wherein the read path is electrically isolated from the pad in response to the reference voltage monitoring signal.

2. The semiconductor integrated circuit according to claim 1, wherein the write path comprises:
   an input buffer coupled to the pad.

3. The semiconductor integrated circuit according to claim 2, wherein the reference voltage output control block is configured to apply the reference voltage to a path between the pad and the input buffer.

4. The semiconductor integrated circuit according to claim 1, wherein the read path comprises:
   an output driver configured to electrically disconnect an output terminal of the output driver from the pad in response to the reference voltage monitoring signal.

5. The semiconductor integrated circuit according to claim 4, wherein the output driver is configured to drive a signal to be transmitted to the pad in response to a termination signal and data.

6. The semiconductor integrated circuit according to claim 5, wherein the read path further comprises:
   a data output unit configured to output the data to the output driver in response to a clock signal and the termination signal.

7. The semiconductor integrated circuit according to claim 5, wherein the termination signal is provided from a controller outside the semiconductor integrated circuit.

8. A semiconductor integrated circuit comprising:
   a pad;
   a core block;
   an input buffer configured to receive external data through the pad;
   a peripheral circuit block configured to write the external data which is transmitted through the input buffer into the core block, or to receive data read from the core block;
   an output driver configured to receive the data read from the core block through the peripheral circuit block, and to output the data read from the core block through the peripheral circuit block to the pad; and
   a reference voltage output control block configured to apply an internal reference voltage to the pad in response to a reference voltage monitoring signal,
   wherein the output driver is electrically isolated from the pad in response to the reference voltage monitoring signal.

9. The semiconductor integrated circuit according to claim 8, wherein the reference voltage output control block is configured to apply the reference voltage to a path between the pad and the input buffer.

10. The semiconductor integrated circuit according to claim 8, wherein the output driver is configured to drive a signal to be transmitted to the pad using a predetermined termination resistance value in response to a termination signal and data.

11. The semiconductor integrated circuit according to claim 10, wherein the output driver is configured to be electrically discoupled from the pad, regardless of the termination signal, when the reference voltage monitoring signal is activated.

12. The semiconductor integrated circuit according to claim 8, wherein the output driver comprises:
    a driving section configured to pull-up or pull-down a signal to be transmitted to the pad; and
    a driving control section configured to control the driving section in response to the reference voltage monitoring signal, a termination signal, and data.

13. The semiconductor integrated circuit according to claim 12, wherein the driving section comprises:
    a pull-up transistor array coupled to a power supply terminal;
    a termination resistor array coupled to the pull-up transistor array; and
    a pull-down transistor array coupled between the termination resistor array and a ground terminal.

14. The semiconductor integrated circuit according to claim 10, wherein the termination signal is provided from a controller outside the semiconductor integrated circuit.

15. A method for monitoring a reference voltage of a semiconductor integrated circuit, comprising the steps of:
    entering a reference voltage monitoring mode;
    outputting a reference voltage to a predetermined pad through a write path of the semiconductor integrated circuit when entering the reference voltage monitoring mode; and
    electrically isolating a read path of the semiconductor integrated circuit from the pad when entering the reference voltage monitoring mode.

16. The method according to claim 15, wherein the step of isolating the read path from the pad includes:
    driving a signal to be transmitted to the pad, wherein the signal has a predetermined termination resistance value when a termination signal is activated.

17. The method according to claim 16, wherein the termination signal is an external signal provided from an exterior of the semiconductor integrated circuit.

18. The method according to claim 16, wherein the step of isolating the read path includes:
    deactivating the termination signal in the semiconductor integrated circuit.

19. The method according to claim 16, wherein the step of isolating the read path includes:
    deactivating the termination signal using a reference voltage monitoring signal used for entering the reference voltage monitoring mode.

* * * * *